(12) United States Patent
Kengeri et al.

(10) Patent No.: US 6,259,634 B1
(45) Date of Patent: Jul. 10, 2001

(54) PSEUDO DUAL-PORT DRAM FOR SIMULTANEOUS READ/WRITE ACCESS

(75) Inventors: Subramani Kengeri, San Jose; Jawji Chen, Fremont, both of CA (US)

(73) Assignee: Silicon Access Networks, Inc., San Jose, CA (US)

( * ) Notice: Subject to any disclaimer, the term of this patent is extended or adjusted under 35 U.S.C. 154(b) by 0 days.

(21) Appl. No.: 09/576,105

(22) Filed: May 22, 2000

(51) Int. Cl.[7] .................................................. G11C 7/00
(52) U.S. Cl. ............................ 365/189.04; 365/230.05; 365/233
(58) Field of Search ............................ 365/189.04, 233, 365/230.05, 189.01

(56) References Cited

U.S. PATENT DOCUMENTS

| | | | |
|---|---|---|---|
| 5,249,165 | * 9/1993 | Toda | 365/189.04 |
| 5,490,112 | * 2/1996 | Hush et al. | 365/189.04 |
| 5,726,948 | * 3/1998 | Hush et al. | 365/189.04 |
| 5,953,285 | * 9/1999 | Churchill et al. | 365/365 |
| 5,963,497 | * 10/1999 | Holland | 365/222 |

* cited by examiner

*Primary Examiner*—Son T. Dinh
(74) *Attorney, Agent, or Firm*—Fernandez & Associates, LLP

(57) ABSTRACT

A system and/or method for simultaneous read/write access of 1-Transistor (1-T) dynamic random access memory (DRAM), which does not rely on a dual-port DRAM to perform read and write accesses within single clock cycle. A single-port 1-T DRAM works with modified design of read sense amplifier to perform both read and write accesses within single clock cycle, thereby retaining high performance and compact size that characterize the 1-T DRAM while allowing simultaneous read/write access that characterizes dual-port memory. Hence, single-port 1-T DRAM constitutes a pseudo dual-port 1-T DRAM that emulates the dual-port DRAM's ability in performing simultaneous read/write memory access of 1-T DRAM.

27 Claims, 7 Drawing Sheets

| Actions \ Gates performed in one clock cycle | WL pass gate (311) | WL pass gate (312) | Read pass gate (371) | Write pass gate (379) | Return pass gate (377) |
|---|---|---|---|---|---|
| Initiating read of cell 301 | On | Off | On | Off | don't care |
| Completing read of cell 301 | don't care | don't care | don't care | don't care | Off |
| Initiating write to cell 302 | don't care | don't care | don't care | don't care | Off |
| Completing write to cell 302 | Off | On | Off | On | Off |
| Initiating data return to cell 301 | don't care | Off | Off | Off | On |
| Completing data return to cell 301 | On | Off | Off | On | don't care |

PSEUDO DUAL-PORT DRAM FOR SIMULTANEOUS READ/WRITE ACCESS

FIELD OF INVENTION

The invention relates to computer memory, particularly to a dynamic random access memory (DRAM) based system and/or method for simultaneous read/write memory access.

BACKGROUND OF INVENTION

DRAM is often chosen over other faster types of computer memory because a DRAM cell's smaller size allows many more DRAM cells to be packed into a given chip area. In particular, a typical DRAM cell is comprised of a transistor and a capacitor. Thus, a typical DRAM cell is well suited as a building block for constructing memory on increasingly miniaturized silicon chips.

However, DRAM has drawbacks. With slower speed as compared to other types of memory such as a static random access memory (SRAM), DRAM is limited to less time-critical memory applications. As such, in order to offset DRAM's slower speed, dual port is typically implemented for DRAM in order to reduce access time to a DRAM module. Unfortunately, adapting a dual-port DRAM offsets DRAM's compact size advantage. In particular, a dual-port DRAM necessitates twice as many DRAM cells as that of a single-port DRAM. Thus, using a dual-port DRAM entails significant cost (i.e., on the order of two) and circuits design penalty.

Thus, a need exists for "true" random access and simultaneous write and read memory bandwidth without incurring the cost and penalty of a dual-port conventional DRAM.

SUMMARY OF INVENTION

The invention is drawn to a system and/or method for simultaneous read/write access of 1-Transistor (1-T) dynamic random access memory (DRAM). Specifically, in contrast to the prior art approaches, the invention does not rely on a dual-port DRAM to perform both read and write accesses within one single clock cycle. Rather, the invention implements a single-port 1-T DRAM that works in conjunction with a modified design of read sense amplifier (RSA) to perform both read and write accesses effectively within one single clock cycle. As such, the invention retains the compact size that characterize the 1-T DRAM, while allowing high Performance and simultaneous read/write access that characterizes dual-port memory. Hence, the single-port 1-T DRAM of the invention constitutes a pseudo dual-port 1-T DRAM that emulates the dual-port 1-T DRAM's ability in performing simultaneous read/write access of 1-T DRAM.

Preferably, a read access and a write access to a single-port 1-T DRAM are initiated effectively within the same clock cycle. The single-port DRAM is comprised of a pair of cells that share a single local bit line (LBL) to a RSA region comprising a RSA. The RSA region is coupled to a read global bit line (RGBL) and a write global bit line (WGBL). In turn, the RGBL is coupled to the RSA and transfers any read data out from the RSA region, while the WGBL is coupled to the LBL and transfers any write data into the RSA region.

As read access begins in a clock cycle, a first data in one cell (from the pair of cells) is transferred to the RSA via the LBL. Then, upon the first data arriving at the RSA effectively in the same clock cycle, the LBL is isolated from the RSA by shutting off a read pass gate disposed between the LBL and the RSA. In so doing, the LBL is made available for transferring any write data into the single-port 1-T DRAM. In the mean time, still effectively in the same clock cycle, the first data is read out from the RSA via the RGBL.

Effectively in the same clock cycle, as write access begins independent of the read memory access, a second data to be written to another cell (of the pair of cells) is driven onto the WGBL and held therein. The second data is prevented to reach the LBL by a shut-off write pass gate disposed between the LBL and the WGBL. Effectively in the same clock cycle, upon having isolated the LBL from the RSA, the write pass gate is switched on to allow the second data held in the WGBL to enter the LBL, thereby writing the second data into the second cell.

BRIEF DESCRIPTION OF DRAWINGS

FIG. 4 presents a table of gate states for gates shown in FIG. 3.

DETAILED DESCRIPTION OF PREFERRED EMBODIMENT(S)

Reference is made in detail to the preferred embodiments of the invention, a pseudo dual-port dynamic random access memory (DRAM) for emulating simultaneous read/write access of a dual-port DRAM. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

The invention is drawn to a system and/or method for simultaneous read/write access of 1-Transistor (1-T) DRAM. Specifically, in contrast to the prior art approaches, the present invention does not rely on a dual-port 1-T DRAM to perform both read and write accesses effectively within one single clock cycle. Rather, the present invention implements a single-port 1-T DRAM that works in conjunction with a modified design of read sense amplifier (RSA) to perform both read and write accesses effectively within one single clock cycle. As such, the invention retains the high performance and compact size that characterize the 1-T DRAM, while allowing simultaneous read/write access that characterizes dual-port memory. Hence, the single-port 1-T DRAM of the invention constitutes a pseudo dual-port 1-T DRAM that emulates the dual-port 1-T DRAM's ability in performing simultaneous read/write access of 1-T DRAM.

Figure 1:
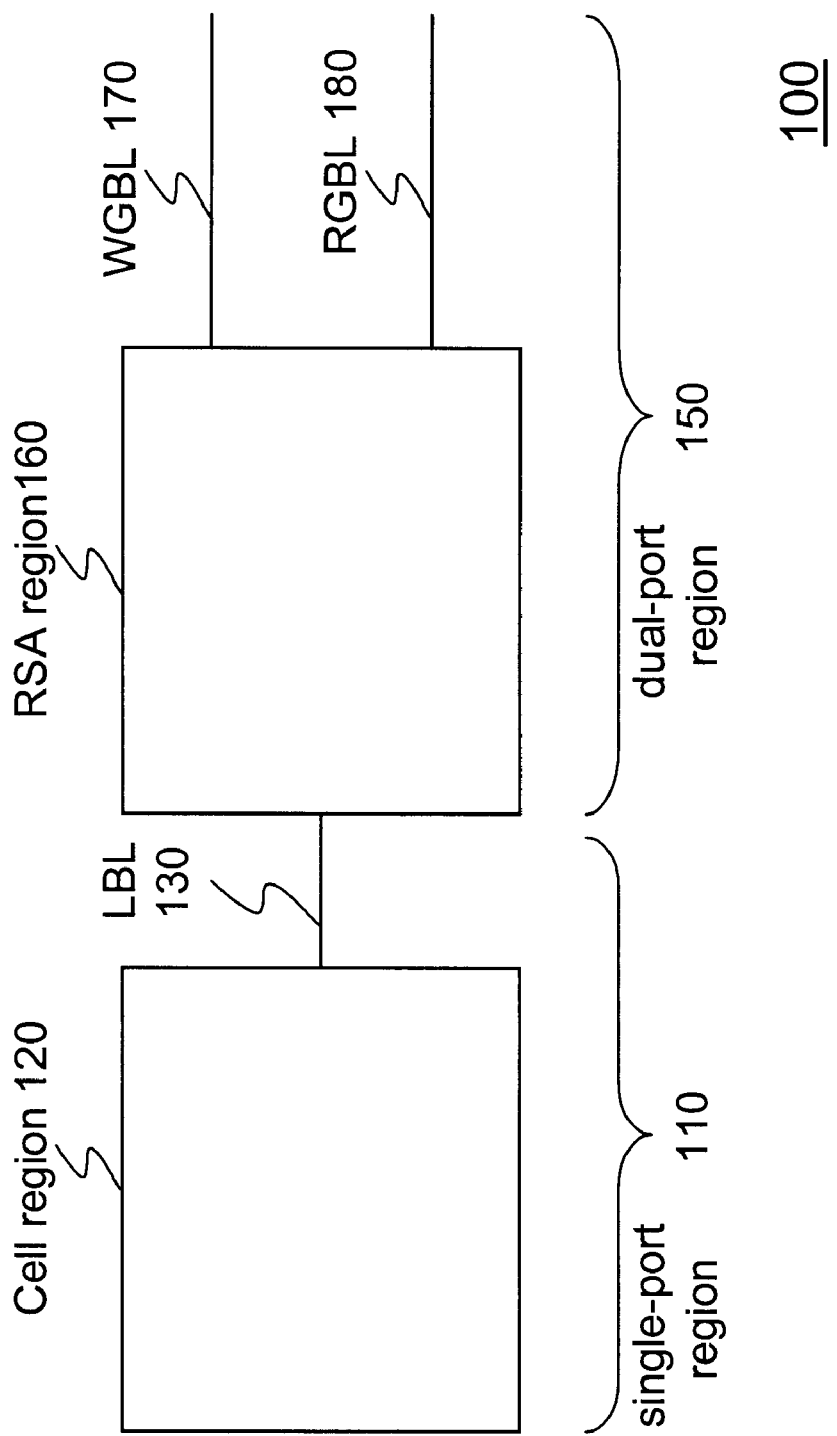
FIG. 1 depicts a simplified view of an integrated circuit (IC) system in accordance with one embodiment of the invention.

Referring now to FIG. 1, a simplified view of an integrated circuit (IC) system 100 is depicted in accordance with one embodiment of the invention. This simplified view of IC system 100 distills the organization of constituents in IC system 100.

Continuing with FIG. 1, IC system 100 includes a single-port region 110 and a dual-port region 120. Single-port region 110 further includes a cell region 120 and a local bit line (LBL) 130. Dual-port region 150 further includes a read sense amplifier (RSA) region 150, a write global bit line (WGBL) 170, and a read global bit line (RGBL) 180. Also as shown, LBL 130 couples cell region 120 to RSA region 150 while RGBL 180 and WGBL 170 extend from RSA region 150.

Referring still to FIG. 1, cell region 120 is comprised of 1-T DRAM cells (not shown). Data are read out from these cells through LBL 130, while data are also written into these cells through LBL 130. Because LBL 130 does not allow a read access to be performed simultaneously with a write access, LBL 130 provides single-port access to cells in cell region 110. Thus, cell region 110 together with LBL 130 constitutes single-port region 110 of IC system 100.

Referring yet still to FIG. 1, RSA region 160 is comprised of various pass gates and a RSA (not shown). RGBL 180 transfers data stored in the RSA away from RSA region 160. WGBL 170 transfers data into RSA region 160. Specifically, because RGBL 180 and WGBL 170 allow a read access to be performed simultaneously with a write access, RGBL 180 and WGBL 170 provide dual-port access to RSA region 160. Thus, RSA region 160 together with RGBL 180 and WGBL 170 constitutes a dual-port region 150 of IC system 100.

Figure 2:
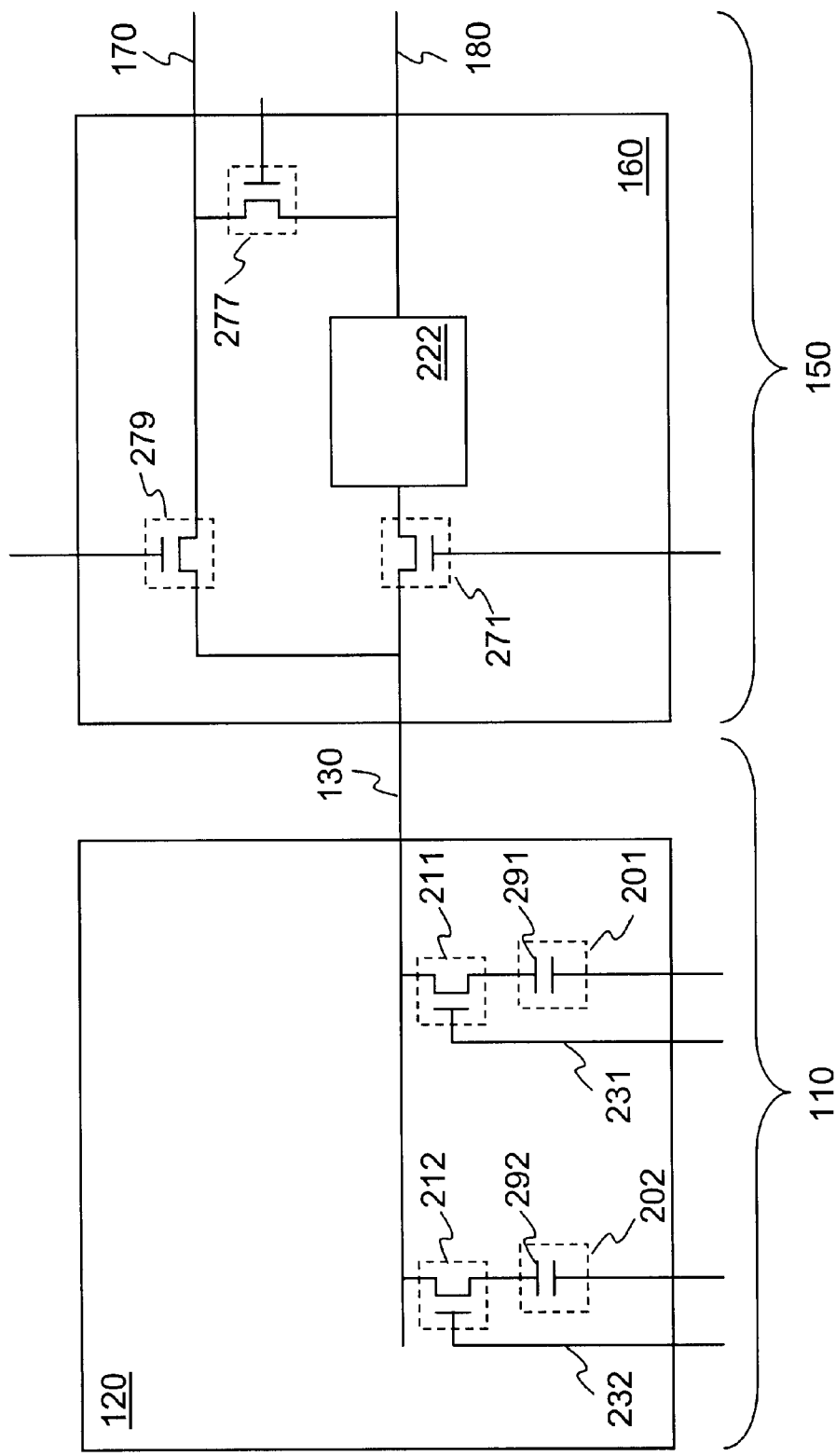
FIG. 2 depicts a more detailed view of the IC system shown in FIG. 1.

Referring now to FIG. 2, IC system 100 (introduced in FIG. 1) is depicted in more detail. Again, IC system 100 includes single-port region 110 having cell region 120 and LBL 130. Also again, IC system 100 includes dual-port region 150 having RSA regions 160, WGBL 170, and RGBL 180.

As shown in FIG. 2, cell region 120 is comprised of a pair of cells 201–202 that share LBL 130. However, cell region 120 can include more than two cells that share LBL 130. LBL 130 extends into cell region 120 and RSA region 160. Moreover, LBL 130 is adapted for reading data out from either cell 201 or cell 202. LBL 130 is also adapted for writing data into either cell 201 or cell 202. In particular, as will be explained below, LBL 130 allows in the same clock cycle reading and writing respectively to two different cells within cell region 120. For example, effectively within one clock cycle, LBL 130 allows reading a data out from cell 201 into RSA region 160 and writing a data from RSA region into cell 202.

On the one hand, continuing with FIG. 2, LBL 130 is coupled to both cells 201–202, wherein each cell has a capacitor for storing data. Specifically, cell 201 includes therein a capacitor 291, while cell 202 includes therein a capacitor 292. In addition, a word line (WL) gate 211 is shown situated between LBL 130 and cell 201, wherein a WL 231 is implemented for switching WL pass gate 211. As such, read or write access to cell 201 requires that WL pass gate 21 1 be switched on; otherwise, WL pass gate 211 in its shut-off state isolates cell 201 from LBL 130, thereby preventing access to capacitor 291 of cell 201. Similarly for cell 202, a WL pass gate 212 is situated between LBL 130 and cell 202, wherein a WL 232 is implemented for switching WL pass gate 212. As such, read or write access to cell 202 requires that WL pass gate 212 be switched on; otherwise, WL pass gate 212 in its shut-off state isolates cell 202 from LBL 130, thereby preventing access to capacitor 292 of cell 202.

On the other hand, referring still to FIG. 2, LBL 130 extends into RSA region 160 to couple with a RSA 222 and WGBL 170. As such, cells 201–202 are coupled to RSA region 160 by LBL 130. As any read data is read from a cell from cell region 120, that data is transferred through LBL 130 to RSA 222 and stored therein. Also, effectively in the same clock cycle, as any write data is driven onto WGBL 170, that write data is transferred through LBL 130 to the intended recipient cell within cell region 120. Furthermore, effectively in the same clock cycle, RGBL 180 is adapted to read out the data stored in RSA 222, while WGBL 170 is adapted to write any data into a cell within cell region 120.

Continuing with FIG. 2, RSA region 160 includes a read pass gate 271, a write pass gate 279, and a return pass gate 277. Specifically, read pass gate 271 is disposed between LBL 130 and RSA 222. When read pass gate 271 is turned on, it provides a path for a data from cell region 120 to enter RSA 222 through LBL 130. When read pass gate 271 is shut off, it isolates LBL 130 from RSA, thereby preventing any data from cell region 120 to enter RSA 222 through LBL 130.

Referring still to FIG. 2, write pass gate 279 is disposed between LBL 130 and WGBL 170. When write pass gate 279 is in its shut off, it stops any data held in WGBL 170 in progressing to LBL 130. When write pass gate 279 is turned on after LBL 130 is isolated from RSA 222 by shutting off read pass gate 271, write pass gate 279 provides a path for the data held in WGBL 170 to enter LBL 130 such that the data can be written into a cell.

Referring still to FIG. 2, return pass gate 277 is disposed between RGBL 180 and WGBL 170. Return pass gate 277 is adapted for cell data refresh or cell data restore. Specifically, when a data from a cell has been stored in RSA 222, return pass gate 277 in its turn-on state provides a path for this data to enter WGBL and held therein. Then, the data can be written back to the same cell when LBL 130 is isolated from any other cell. When return pass gate 277 is shut off, it isolates RSA from WGBL 170, thereby preventing any data stored in RSA 222 to return to any cell of cell region 120. Thus, in its shut-off state, return pass gate 277 prevents any cell in cell region 120 from being refreshed or restored.

In another embodiment, cell region 120 is comprised of two additional cells: a third cell and a fourth cell sharing a second LBL. This second LBL has analogous functions to that of the first LBL (i.e., LBL 130 of FIG. 2). That is, the relationship among the second LBL, third and fourth cells, and the RSA region is analogous to the relationship among the first LBL, first and second cells, and the RSA region. For example, as the first LBL is used for accessing data in the first and second cells, the second LBL is used for accessing data in the third and fourth cell. Moreover, just as the first LBL is coupled to the WGBL and the RSA, the second LBL is also coupled to the WGBL and the RSA.

Figure 3:
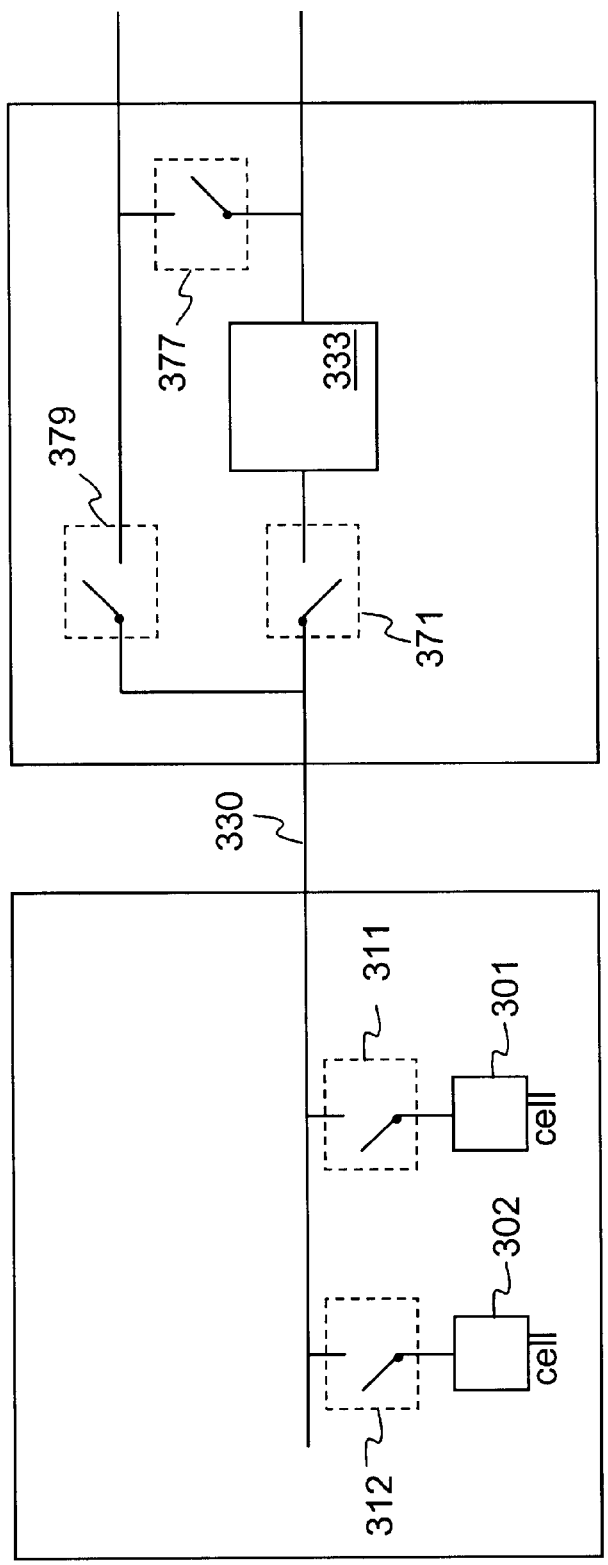
FIG. 3 depicts a symbolic representation of the IC system shown in FIG. 2.

Referring now to FIG. 3 in view of FIG. 2, a symbolic representation 300 of IC system 100 (as shown in FIG. 2) is depicted in accordance with one embodiment of the invention. Symbolic representation 300 includes a single-port region 310 and a dual-port region 350.

Continuing with FIG. 3 in view of FIG. 2, single-port region 310 has a cell region 320 comprising two cells 301–302 that share a LBL 330. Cell 301 is coupled to LBL 330 by a switch 311 that symbolizes WL pass gate 231, while cell 302 is coupled to LBL 330 by a switch 312 that symbolizes WL pass gate 232.

As shown in FIG. 3, dual-port region 350 is coupled to single-port region 310 by LBL 330. Dual-port region 350 includes a RSA region 360 that has a RSA 333, switches 371, 377, and 379. Specifically, switch 371 symbolizes read pass gate 271; switch 377 symbolizes return pass gate 277; and switch 379 symbolizes 279. Also, Dual-port region 350 includes WGBL 370 and RGBL 380 that extends out of RSA region 360.

Referring now to FIG. 4 in view of FIG. 3, a summary table of gate states is presented for gates that are symbolized as switches in FIG. 3. For initiating a read access of cell 301, gate states are implemented according to first row 410 of table entries. For completing the read access of cell 301, gate states are implemented according to second row 420 of table entries. For initiating a write access of cell 302, gate states are implemented according to third row 430 of table entries. For completing the write access of cell 302, gate states are implemented according to fourth row 440 of table entries. For initiating a data return to cell 301 when the data from cell 301 has been stored in RSA 333, gate states are implemented according to fifth row 450. And, for completing the data return to cell 301, gate states are implemented according to sixth row 460.

Figure 5:
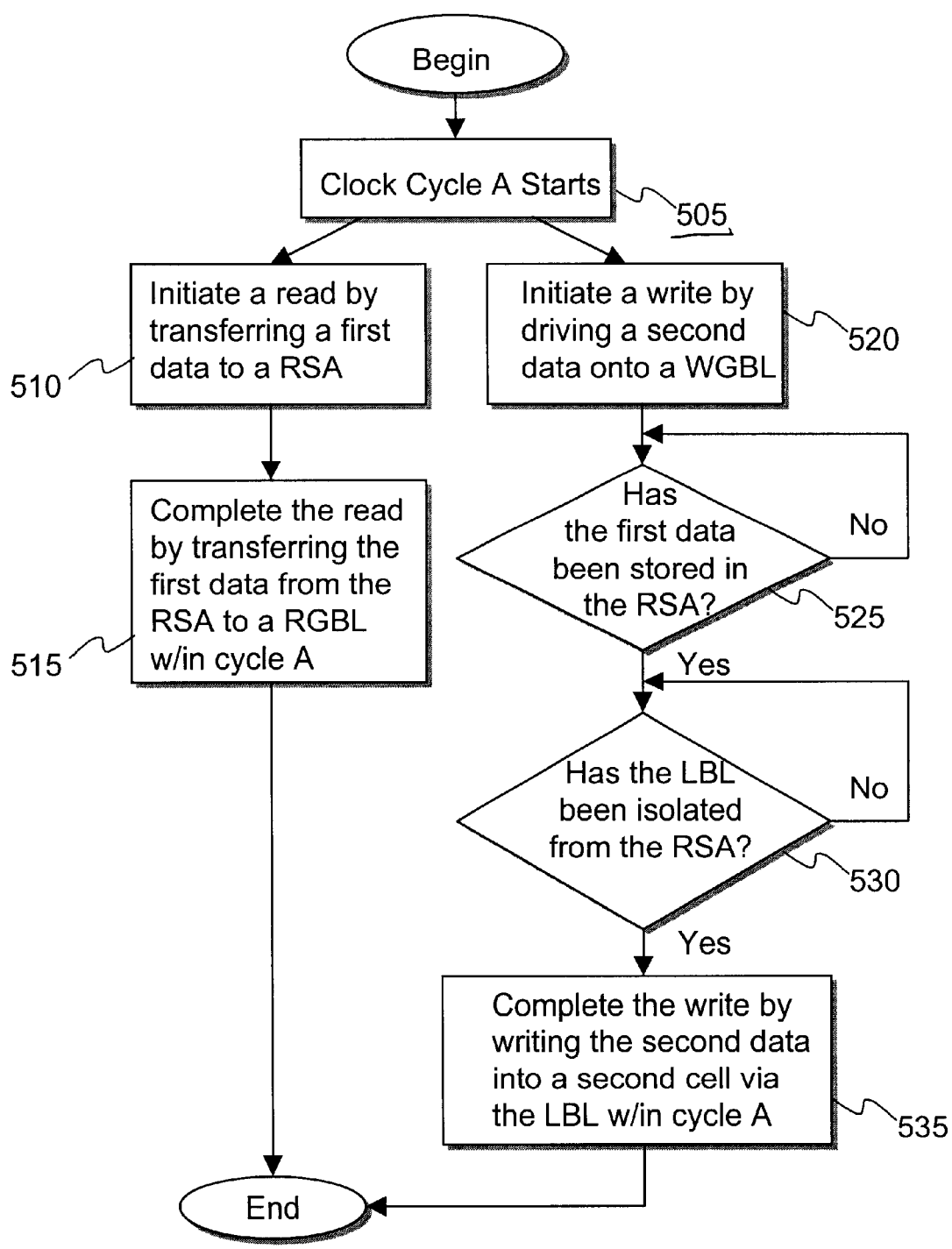
FIG. 5 is a flow chart outlining the steps performed in one embodiment of the invention.

Referring now to FIG. 5, a flow chart outlines the steps performed in one embodiment of the invention. Specifically, in step 505, a clock cycle A begins. Then, step 510 and 520 are independently performed effectively within clock cycle A.

On the one hand, step 510 initiates a read access effectively within clock cycle A. In particular, a first data is transferred from a first cell within a single-port 1-T DRAM to a RSA via a LBL coupled to the first cell. More specifically, a first WL is turned on to enable the read access of the first data from the first cell. Then, a read pass gate between the LBL and the RSA is turned on to provide a path for the first data to enter the RSA. Moreover, the read pass gate is shut off after having stored first data within the RSA so that the LBL is isolated from the RSA. Finally, the first WL is shut off to prevent memory access of the first data in the first cell.

Then, following step 510, step 515 completes the read access effectively within clock cycle A. In particular, when the first data has been stored in the RSA at the conclusion of step 510, the first data is read out from the RSA onto a RGBL coupled to the RSA.

On the other hand, step 520 initiates a write access effectively within clock cycle A. In particular, a second data destined for a second cell within the single-port 1-T DRAM is driven onto a WGBL coupled to the single-port 1-T DRAM. The second data is held on WGBL and prevented from entering the LBL to reach the second cell. At the conclusion of step 520, the second data is poised to be driven onto the LBL for writing the second data to the second cell. More specifically, the second data is isolated from the LBL by turning off a write pass gate situated between the WGBL and the LBL. This write pass gate in its shut-off state stops the progression of the second data from the WGBL to the LBL.

Decision step 525 follows the conclusion of step 520 effectively within clock cycle A. In decision step 525 check is performed to verify that the first data has been stored in the RSA. If the first data has not been stored in the RSA, then the verification of decision step 525 is performed again. If the first data has been stored in the RSA, then decision step 525 is followed by decision step 530.

In decision step 530, effectively within clock cycle A, check is performed to verify that the LBL has been isolated from the RSA. If the LBL has not been isolated from the RSA, then decision step 530 is performed again. If the LBL has been isolated from the RSA, then decision step 530 is followed by step 535.

Following step 530, step 535 completes the write access effectively within clock cycle A. In particular, where the LBL is isolated from the RSA, the second data driven on the WGBL is written into the second cell through the LBL. More specifically, the LBL is isolated from the RSA by shutting off the read pass gate between the LBL and the RSA after having stored the first data in the RSA. Also, the write pass gate in its turn-on state provides a path for the second data to enter the LBL from the WGBL.

In another embodiment of the invention, the second data in step 535 is written into the first cell as well as the second cell, thereby performing a one-time read of the first data. More specifically, the write pass gate is turned on to provide a path for the second data to enter the LBL from the WGBL. In so doing, no clock time is spent in restoring the first data to the first cell. As a result, memory performance is enhanced. Thus, this embodiment is well suited for applications that can work with destructive read.

Figure 6:
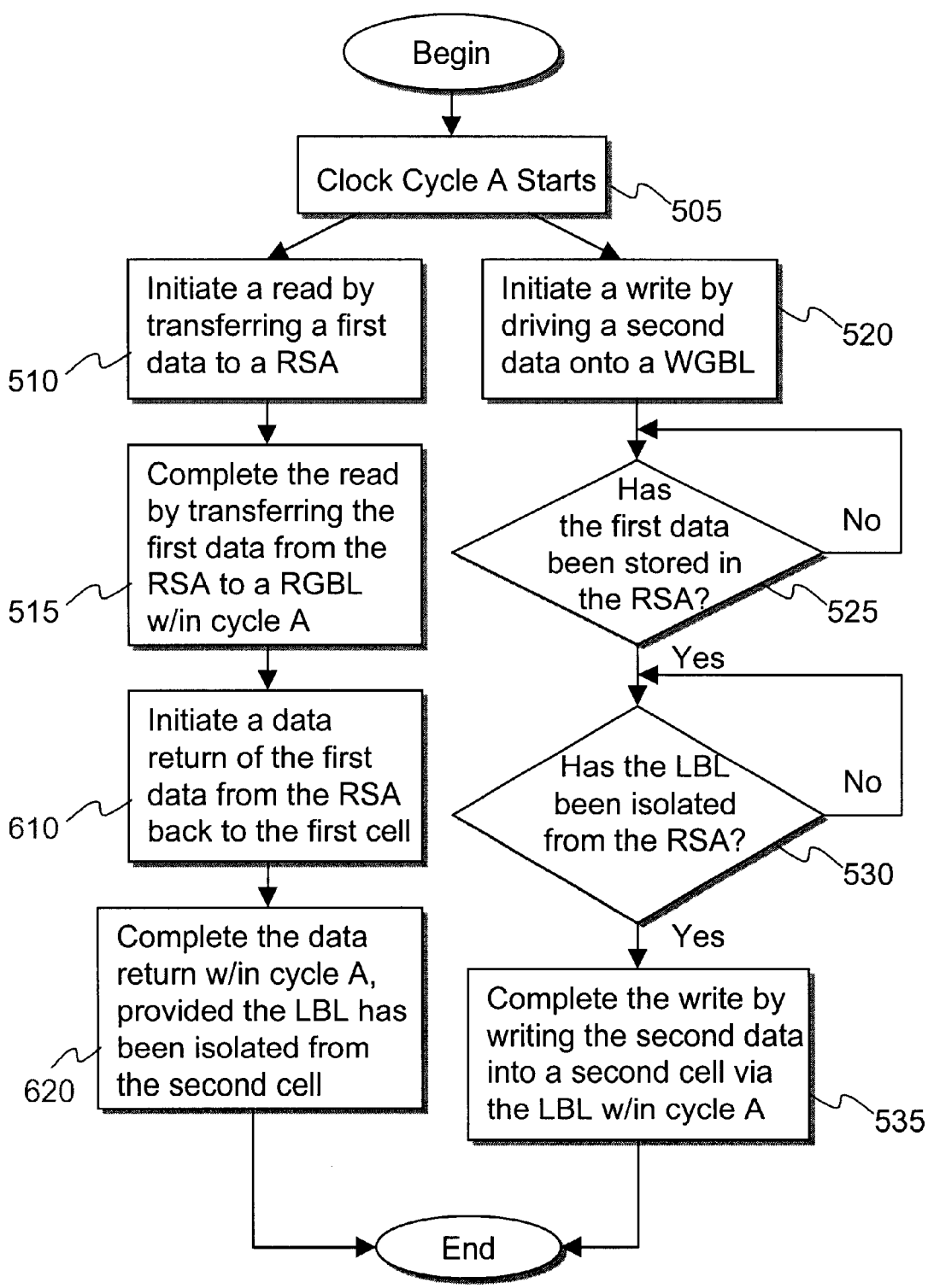
FIG. 6 is a flow chart outlining the steps performed in another embodiment of the invention.

FIG. 6 is a flow chart 600 outlining the steps performed in another embodiment of the invention. When compared to flow chart 500 of FIG. 5, flow chart 600 has additional steps (610 and 620) performed to restore the first data to the first cell.

Referring still to FIG. 6, step 610 follows step 510. In step 610, a return of the first data from the RSA back into the first cell is initiated. Particularly, the return pass gate is turned on to provide a path for the first data stored in the RSA to enter the WGBL. In turn, the first data held in the WGBL, poised to be written back to the first cell, is written back into the first cell.

Continuing with FIG. 6, step 620 follows step 610. In step 620, the return of the first data from the RSA back into the first cell is completed. In particular, provided the LBL has been isolated from the second cell, the first data held in the WGBL is written back into the first cell. As a result, the read access is a non-destructive read.

Figure 7:
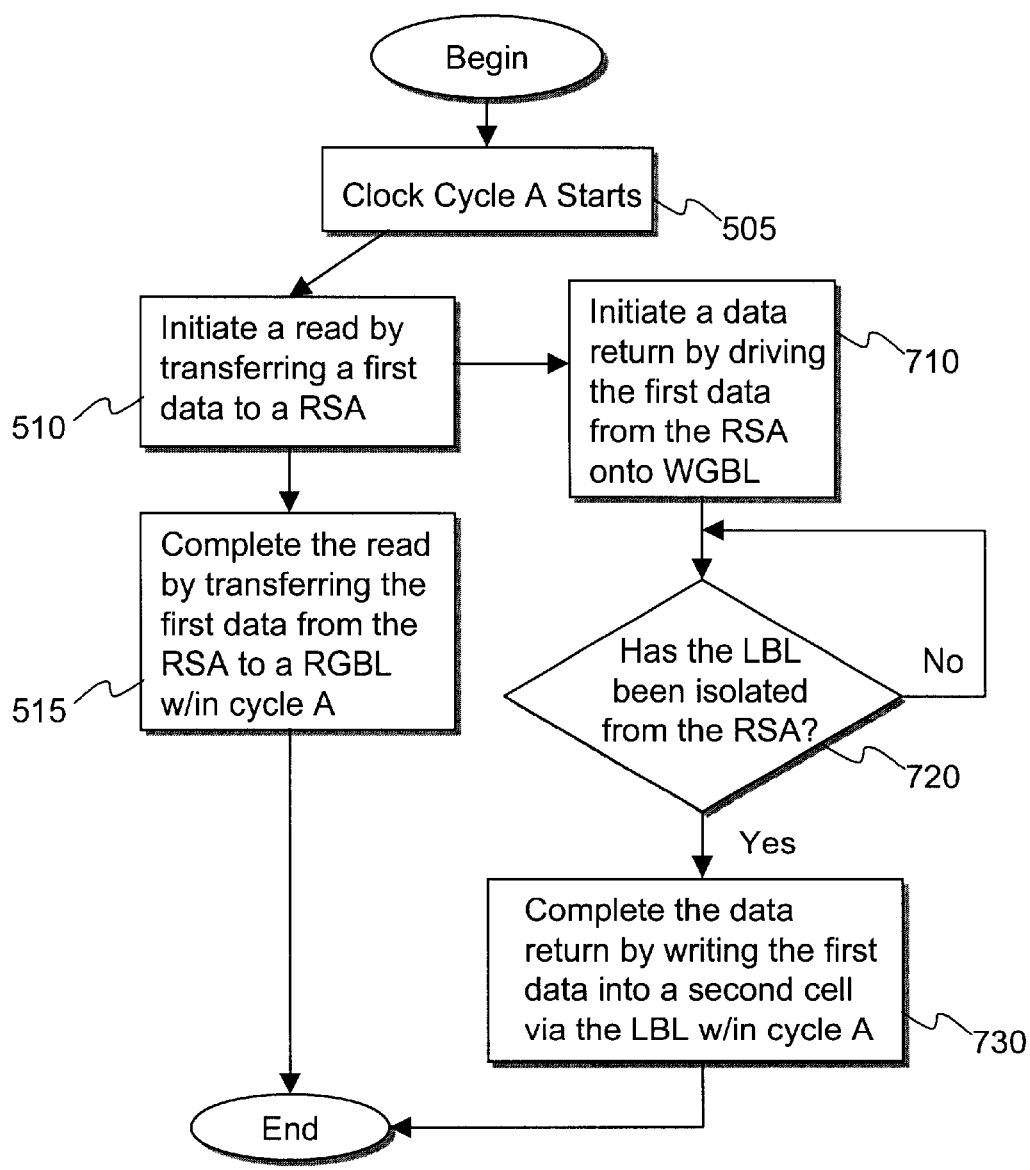
FIG. 7 is a flow chart outlining the steps performed in yet another embodiment of the invention.

FIG. 7 is a flow chart outlining the steps performed in yet another embodiment of the invention. In particular, flow chart 700 outlines the steps for performing "refresh-free" memory access. That is, DRAM cell refresh does not require extra clock cycles. Rather, the refresh can be performed with other memory access effectively in the same clock cycle.

Continuing with FIG. 7, step 710 follows step 510. In step 710, effectively in the same clock cycle, a write memory access of the first data into a second cell is initiated. Specifically, the return pass gate is turned on to provide a path for the first data stored in the RSA to enter the WGBL.

Referring still to FIG. 7, decision step follows step 710. Check is made to verify whether the LBL has been isolated from the RSA. If the LBL has not been isolated from the RSA, then check is made again. If the LBL has been isolated from the RSA, then step 730 is performed.

Referring still to FIG. 7, step 730 follows step 720. In step 730, effectively in the same clock cycle, the write access of the first data into the second cell is completed. Specifically, the first data held in WGBL is written into the second cell via the LBL.

In summary, the invention implements a single-port 1-T DRAM that works in conjunction with a modified design of RSA to perform both read and write memory accesses effectively within one single clock cycle. As such, the invention retains the high performance and compact size that characterize the 1-T DRAM, while allowing simultaneous read/write memory access that characterizes dual-port memory. Hence, the single-port 1-T DRAM of the present invention constitutes a pseudo dual-port 1-T DRAM that emulates the dual-port 1-T DRAM's ability in performing simultaneous read/write memory access of 1-T DRAM.

Foregoing described embodiments of the invention are provided as illustrations and descriptions. They are not intended to limit the invention to precise form described. In particular, Applicant(s) contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A method for performing simultaneous read/write memory access of 1 transistor dynamic random access memory (1-T DRAM), said method comprising the steps of:
   a) in a clock cycle, initiating a read memory access of a first cell of a single-port 1-T DRAM, wherein a first data is transferred from said first cell via a local bit line (LBL) of said first cell to a read sense amplifier (RSA);
   b) in said clock cycle, upon said first data having been stored within said RSA, completing said read memory access, wherein said first data is read out from said RSA onto a read global bit line (RGBL) coupled to said single-port 1-T DRAM;
   c) in said clock cycle, independent of said read memory access comprising said steps a) and b), initiating a write memory access of a second cell of said single-port 1-T DRAM, wherein said second cell shares said LBL with said first cell, and wherein a second data is driven onto a write global bit line (WGBL) coupled to said single-port 1-T DRAM such that said second data is isolated from said LBL and poised to be driven onto said LBL for writing said second data to said second cell; and
   d) in said clock cycle, provided said first data has been stored within said RSA and provided said LBL has been isolated from said RSA, completing said write memory access, wherein said second data driven on said WGBL is written into said second cell through said LBL.

2. The method of claim 1, wherein said step a) is further comprised of:
   a1) turning on a first word line (WL) of said first cell in order to enable said read access of said first data from said first cell;
   a2) turning on a read pass gate disposed between said LBL and said RSA in order to provide a path for said first data to enter said RSA;
   a3) shutting off said read pass gate after said first data having been stored within said RSA in order to isolate said LBL from said RSA; and
   a4) shutting off said first WL in order to prevent memory access of said first data stored in said first cell.

3. The method of claim 1 adapted for non-destructive read, wherein said step b) is further comprised of:
   b1) in said clock cycle, initiating a return of said first data back into said first cell, wherein a return pass gate disposed between said RGBL and said WGBL is turned on to provide a path for said first data stored in said RSA to enter said WGBL, said return pass gate in its switched-off state isolating said first data stored in said RSA from said WGBL; and
   b2) in said clock cycle, completing said return of said first data back into said first cell, wherein said first data held in WGBL is written back into said first cell upon said LBL having been isolated from said second cell.

4. The method of claim 1, wherein in said step c) said second data is isolated from said LBL by turning off a write pass gate disposed between said WGBL and said LBL, said turned off write pass gate stopping the progression of said second data from said WGBL to said LBL.

5. The method of claim 1, wherein in said step d) said LBL is isolated from said RSA by shutting off a read pass gate disposed between said LBL and said RSA after said first data having been stored within said RSA.

6. The method of claim 1, wherein said step d) is further comprised of:
   d1) turning on a write pass gate disposed between said WGBL and said LBL to provide a path for said second data to enter said LBL from said WGBL, wherein said write pass gate in its shutoff state is adapted to stop said second data in progressing from said WGBL to said LBL.

7. The method of claim 1 adapted for a restrictive read (one-time read) scenario, wherein said step d) is replaced by the step of:
   d1) in said clock cycle, upon said first data having been stored within said RSA, completing said write memory access, wherein said second data driven on said WGBL is written through said LBL into said first cell and said second cell, thereby replacing said first data stored in said first cell by said second data.

8. The method of claim 7, wherein said step d1) is further comprised of:
   d11) turning on a write pass gate disposed between said WGBL and said LBL to provide a path for said second data to enter said LBL from said WGBL, wherein said write pass gate in its shut-off state is adapted to stop said second data in progressing from said WGBL to said LBL.

9. The method of claim 1 adapted to perform 1-T DRAM refresh of said first cell within said clock cycle, wherein said step c) and said step d) are replaced by the steps of:
   e) initiating a write memory access of said first data into a second cell coupled to said LBL, wherein a return pass gate disposed between said RGBL and said WGBL is turned on to provide a path for said first data stored in said RSA to enter said WGBL, said return pass gate in its switched-off state isolating said first data stored in said RSA from said WGBL; and
   f) completing said write access of said first data into said second cell, wherein said first data held in WGBL is written into said second cell.

10. An integrated circuit (IC) system for performing simultaneous read/write memory access of 1-T DRAM, said IC system comprising:
   a single-port 1-T DRAM cell region comprising a first cell and a second cell that share a LBL, wherein said LBL is adapted for reading out a first data from said first cell in a clock cycle, and wherein said LBL is also adapted for writing in a second data to said second cell in said clock cycle; and
   a dual-port RSA region coupled to said single-port 1-T DRAM cell region, said dual-port RSA region comprising a RSA coupled to said first and second cells by said LBL, wherein said RSA region is coupled to a RGBL adapted to read out said first data from said first cell in said clock cycle, and wherein said dual-port RSA region is also coupled to a WGBL adapted to write in a second data to said second cell in said clock cycle.

11. The IC system of claim 10, wherein said single-port 1-T DRAM cell region is further comprised of:
a first WL coupled to said first cell such that said first WL in its turned-on state enables said read access of said first data from said first cell; and
a second WL coupled to said second cell such that said second WL in its turn-on state enables said write access of said second data into said second cell.

12. The IC system of claim 10, wherein said dual-port RSA region is further comprised of:
a read pass gate disposed between said LBL and said RSA, wherein said read pass gate is adapted to provide a path for said first data to enter said RSA, and wherein said read pass gate is adapted to isolate said LBL from said RSA by shutting off after said first data having been stored within said RSA.

13. The IC system of claim 10, wherein said dual-port RSA region is further comprised of:
a write pass gate disposed between said LBL and said WGBL, wherein said write pass gate in its shut-off state is adapted to stop said second data in progressing from said WGBL to said LBL, and wherein said write pass gate is switched to its turn-on state after said LBL is isolated from said RSA such that said turn-on state of said write pass gate provides a path for said second data to enter said LBL.

14. The IC system of claim 10, wherein said dual-port RSA region is further comprised of:
a return pass gate disposed between said RGBL and said WGBL, wherein upon having stored said first data in said RSA, said return pass gate provides a path for said first data from said RSA to enter said WGBL and held therein such that said first data is written back to said first cell when said LBL is isolated from said second cell.

15. The IC system of claim 10 adapted for a restrictive read (one-time read) scenario, wherein in said clock cycle, upon said first data having been stored within said RSA, said second data is driven on said WGBL and written through said LBL into said first cell and second cell, thereby replacing said first data stored in said first cell by said second data.

16. The IC system of claim 15, wherein a write pass gate disposed between said WGBL and said LBL is turned on to provide a path for said second data to enter said LBL from said WGBL, wherein said write pass gate in its shut-off state is adapted to stop said second data in progressing from said WGBL to said LBL.

17. The IC system of claim 10 adapted for non-destructive read, wherein a return pass gate disposed between said RGBL and said WGBL is turned on to provide a path for said first data stored in said RSA to enter said WGBL, said return pass gate in its switched-off state isolating said first data stored in said RSA from said WGBL; and
wherein said first data held in WGBL is written back into said first cell upon said LBL having been isolated from said second cell.

18. The IC system of claim 10 adapted to perform 1-T DRAM refresh of said first cell within said clock cycle, wherein said write memory access is replaced by a new write memory access of said first data into said second cell, wherein a return pass gate disposed between said RGBL and said WGBL is turned on to provide a path for said first data stored in said RSA to enter said WGBL, said return pass gate in its switched-off state isolating said first data stored in said RSA from said WGBL; and
wherein said first data held in WGBL is written into said second cell for completing said write access of said first data into said second cell.

19. An IC system for performing simultaneous read/write memory access of 1T DRAM, said IC system comprising:
a first single-port 1-T DRAM cell region comprising a first cell and a second cell that share a first LBL, wherein said first LBL is adapted for reading out a first data from said first cell in a first clock cycle, and wherein said LBL is also adapted for writing in a second data to said second cell in said first clock cycle;
a dual-port RSA region coupled to said first single-port 1-T DRAM cell region, said first dual-port RSA region comprising a RSA coupled to said first and second cells by said first LBL, wherein said first RSA region is coupled to a RGBL adapted to read out said first data from said first cell in said first clock cycle, and wherein said dual-port RSA region is also coupled to a WGBL adapted to write in a second data to said second cell in said first clock cycle;
said single-port 1-T DRAM cell region comprising a third cell and a fourth cell that share a second LBL, wherein said second LBL is adapted for reading out a third data from said third cell in a second clock cycle, and wherein said second LBL is also adapted for writing in a fourth data to said fourth cell in said second clock cycle; and
said dual-port RSA region coupled to said second single-port 1-T DRAM cell region, said dual-port RSA region comprising said RSA coupled to said third and fourth cells by said second LBL, wherein said RSA region is coupled to said RGBL adapted to read out said third data from said third cell in said second clock cycle, and wherein said dual-port RSA region is also coupled to said WGBL adapted to write in a fourth data to said fourth cell in said second clock cycle.

20. The IC system of claim 19, wherein said single-port 1-T DRAM cell region is further comprised of:
a first WL coupled to said first cell such that said first WL in its turned-on state enables said read access of said first data from said first cell;
a second WL coupled to said second cell such that said second WL in its turn-on state enables said write access of said second data into said second cell;
a third WL coupled to said third cell such that said third WL in its turned-on state enables said read access of said third data from said third cell; and
a fourth WL coupled to said fourth cell such that said fourth WL in its turn-on state enables said write access of said fourth data into said fourth cell.

21. The IC system of claim 19, wherein said dual-port RSA region is further comprised of:
a read pass gate disposed between said first LBL and said RSA, wherein said read pass gate in its turn-on state is adapted to provide a path for said first data to enter said RSA, and wherein said read pass gate is adapted to isolate said first LBL from said RSA by shutting off after said first data having been stored within said RSA; and
said read pass gate disposed between said second LBL and said RSA, wherein said read pass gate in its turn-on state is adapted to provide a path for said third data to enter said RSA, and wherein said read pass gate is adapted to isolate said second LBL from said RSA by shutting off after said third data having been stored within said RSA.

22. The IC system of claim 19, wherein said dual-port RSA region is further comprised of:

a first write pass gate disposed between said first LBL and said WGBL, wherein said first write pass gate in its shut-off state is adapted to stop said second data in progressing from said WGBL to said first LBL, and wherein said first write pass gate is switched to its turn-on state after said first LBL is isolated from said RSA such that said turn-on state of said first write pass gate provides a path for said second data to enter said first LBL; and a second write pass gate disposed between said second LBL and said WGBL, wherein said second write pass gate in its shut-off state is adapted to stop said fourth data in progressing from said WGBL to said second LBL, and wherein said second write pass gate is switched to its turn-on state after said second LBL is isolated from said RSA such that said turn-on state of said second write pass gate provides a path for said fourth data to enter said second LBL.

23. The IC system of claim 19, wherein said dual-port RSA region is further comprised of:

a return pass gate disposed between said RGBL and said WGBL, wherein upon having stored said first data in said RSA, said return pass gate in its turn-on state provides a path for said first data from said RSA to enter said WGBL and held therein such that said first data is written back to said first cell in said first clock cycle provided said first LBL is isolated from said second cell; and wherein upon having stored said third data in said RSA, said return pass gate in its turn-on state provides a path for said third data from said RSA to enter said WGBL and held therein such that said third data is written back to said third cell in said second clock cycle provided said second LBL is isolated from said fourth cell.

24. The IC system of claim 19 adapted for a restrictive read (one-time read) scenario, wherein in said first clock cycle, upon said first data having been stored within said RSA, said second data is driven on said WGBL and written through said first LBL into said first cell and second cell, thereby replacing said first data stored in said first cell by said second data; and wherein in said second clock cycle, upon said third data having been stored within said RSA, said fourth data is driven on said WGBL and written through said second LBL into said third cell and fourth cell, thereby replacing said third data stored in said third cell by said fourth data.

25. The IC system of claim 24, wherein in said first clock cycle a first write pass gate disposed between said WGBL and said LBL is turned on to provide a path for said second data to enter said first LBL from said WGBL, wherein said first write pass gate in its shut-off state is adapted to stop said second data in progressing from said WGBL to said first LBL; and wherein in said second clock cycle a second write pass gate disposed between said WGBL and said second LBL is turned on to provide a path for said fourth data to enter said second LBL from said WGBL, wherein said second write pass gate in its shut-off state is adapted to stop said fourth data in progressing from said WGBL to said second LBL.

26. The IC system of claim 19 adapted for non-destructive read, wherein a return pass gate disposed between said RGBL and said WGBL is turned on to provide a path for said first data stored in said RSA to enter said WGBL, said return pass gate in its switched-off state isolating said first data stored in said RSA from said WGBL, and wherein said first data held in WGBL is written back into said first cell upon said LBL having been isolated from said second cell; and wherein said return pass gate is turned on to provide a path for said third data stored in said RSA to enter said WGBL, said return pass gate in its switched-off state isolating said third data stored in said RSA from said WGBL, and wherein said third data held in WGBL is written back into said third cell upon said second LBL having been isolated from said fourth cell.

27. The IC system of claim 19 adapted to perform 1-T DRAM refresh of said first cell in said first clock cycle and 1-T DRAM refresh of said third cell in said second clock cycle, wherein in said first clock cycle said write memory access of said first data into said first cell is replaced by a first new write memory access of said first data into said second cell, wherein a return pass gate disposed between said RGBL and said WGBL is turned on to provide a path for said first data stored in said RSA to enter said WGBL, said return pass gate in its switched-off state isolating said first data stored in said RSA from said WGBL;

wherein said first data held in WGBL is written into said second cell for completing said first new write access of said first data into said second cell; and wherein in said second clock cycle said write memory access of said third data into said third cell is replaced by a second new write memory access of said third data into said fourth cell, wherein said return pass gate disposed is turned on to provide a path for said third data stored in said RSA to enter said WGBL, said return pass gate in its switched-off state isolating said third data stored in said RSA from said WGBL; and wherein said third data held in WGBL is written into said fourth cell for completing said second new write access of said third data into said fourth cell.

* * * * *